United States Patent [19]
Wagner et al.

[11] Patent Number: 5,927,727
[45] Date of Patent: Jul. 27, 1999

[54] SEALING ELEMENT, PARTICULARLY FOR SHUT-OFF AND REGULATING VALVES, AND PROCESS FOR ITS PRODUCTION

[75] Inventors: Friedrich Wagner, Endingen; Hans-Peter Strelow, Freiburg, both of Germany

[73] Assignee: Friedrich Grohe AG, Hemer, Germany

[21] Appl. No.: 08/836,743

[22] PCT Filed: Nov. 17, 1995

[86] PCT No.: PCT/EP95/04535

§ 371 Date: May 20, 1997

§ 102(e) Date: May 20, 1997

[87] PCT Pub. No.: WO96/16201

PCT Pub. Date: May 30, 1996

[30] Foreign Application Priority Data

Nov. 21, 1994 [DE] Germany .............................. 44 41 132

[51] Int. Cl.[6] .................................................. F16J 15/02
[52] U.S. Cl. ........................................... 277/652; 427/571
[58] Field of Search ..................................... 427/577, 578, 427/489, 571; 251/368; 277/443, 442, 585, 500, 652

[56] References Cited

U.S. PATENT DOCUMENTS

| | | | |
|---|---|---|---|
| 5,137,398 | 8/1992 | Omori et al. ............................. | 408/145 |
| 5,645,900 | 7/1997 | Ong et al. ................................ | 427/571 |
| 5,674,438 | 10/1997 | Patel et al. .............................. | 264/29.2 |

FOREIGN PATENT DOCUMENTS 585583   3/1994   Japan ..................................... 427/577

*Primary Examiner*—Lynne A. Reichard
*Assistant Examiner*—David E. Bochna
*Attorney, Agent, or Firm*—Kanesaka & Takeuchi

[57] ABSTRACT

A sealing element, particularly for shut-off and regulating valves, comprising a tabular, piston-shaped or spherical shut-off body of a ceramic material having a hard material layer containing carbon and silicon applied to a sealing surface of the shut-off body by plasma chemical vapor deposition or plasma polymerization, in a coating chamber. The hard material layer comprises a bonding layer component applied to the sealing surface of the shut-off body and a subsequent sliding layer component. The carbon-containing bonding layer component has a first silicon content favoring adhesion to the sealing surface of the shut-off body and the subsequent carbon-containing sliding layer component having a second silicon content lower than that of the bonding layer component to achieve low coefficients of sliding friction and static friction. The sliding layer component is selected so as to be essentially thin and the bonding layer component is selected so as to be comparatively thick to take up the residual stresses of the sliding layer component. The hard metal layer is heat treated.

12 Claims, 1 Drawing Sheet

SEALING ELEMENT, PARTICULARLY FOR SHUT-OFF AND REGULATING VALVES, AND PROCESS FOR ITS PRODUCTION

BACKGROUND OF THE INVENTION

A sealing element of the above type having a hard material layer which comprises a hard layer component applied to the working surface of the shut-off body and a subsequent covering layer component and the associated plasma CVD coating process for applying the hard material layer to the working surface of the shut-off body is known from DE-A 38 32 692.

According to this document, shut-off bodies are, to coat their working surfaces, placed in the coating chamber on a specimen holder having a negative potential relative to the plasma. For initial physical etching of the working surfaces of the shut-off bodies with argon, the coating unit is first operated as cathode atomization (sputtering) unit. For subsequent deposition of the bonding layer component of the hard material layer on the etched working surface, the same unit is then operated under certain first process parameters as high-frequency plasma CVD unit, with the argon gas in the coating chamber being replaced, for example, by tetramethylsilane. With altered second process parameters, the covering or sliding layer component is then deposited from a gas mixture of tetramethylsilane and hexane after deposition of the bonding layer component.

The sealing elements obtained by this method (these can advantageously be coated ceramic plates for water valves, e.g. single-hand mixers) have, thanks to the hard material layer applied, sufficiently low coefficients of sliding friction and static friction when sliding over one another, even in the presence of water, so that greasing of the sealing surfaces as has hitherto been required for uncoated ceramic plates is no longer necessary.

A disadvantage of the known sealing elements, which are coated with a single-layer and multilayer hard material layer, is that their hot-water resistance is unsatisfactory. This is the case particularly when a hot-water resistance of more than 1000 operating hours is to be achieved without the hard material layer applied becoming detached from the shut-off body.

SUMMARY OF THE INVENTION

It is an object of the invention to provide a sealing element which has both sufficiently low coefficients of static friction and sliding friction on the sliding layer surface and a high hot-water resistance. Preferred sealing elements, in particular in the form of discs, should have a hot-water resistance at 95° C. over a sufficient operating period, for example of at least 1000 hours without, in particular, the adhesion of the hard material layer on the shut-off body being significantly impaired.

The invention relates to a sealing element, particularly for shut-off and regulating valves. It comprises a disc-shaped, piston shaped or spherical shut-off body. The shut-off body can comprise a metallic or nonmetallic material. This material can be, for example, a ceramic material, including aluminum oxide Al O and the various silicon carbides SiC, Si C and silicon nitride Si N.

On a working surface (sealing surface) of the shut-off body, a hard material layer containing carbon and silicon is applied by plasma CVD or plasma polymerization in a coating chamber.

The hard material layer can be essentially homogenous. However, it can also have a lamellar structure. Advantageously, the hard material layer can comprise a bonding layer component applied to the working surface of the shut-off body and a subsequent covering layer (sliding layer) component. The bonding layer component can have a first silicon content favouring adhesion to the working surface of the shut-off body, and the subsequent carbon-containing covering layer component can have a second silicon content lower than that of the bonding layer component, to achieve low coefficients of sliding friction and static friction. The bonding layer component can also be silicon-free.

The deposition from the plasma is carried out by ion bombardment, e.g. by means of a glow discharge of by means of an additional ion gun. From a hydro-carbon-containing atmosphere a wear-resistant, carbon-containing layer having sufficiently low coefficients of sliding friction and static friction can be deposited in this way.

It was surprising that heat treatment of the finished, coated shut-off bodies enables their hot-water resistance to be significantly increased. It could not have been foreseen that a targeted heat treatment of the coated shut-off bodies can achieve, in particular, a strengthening of adhesion of the hard material layer applied to the shut-off body, with astonishingly good reproducible results being able to be achieved, which is of particular importance for manufacture of the sealing elements having the high quality sought in large numbers on an industrial scale.

Particularly good results are achieved according to the invention if the hard material layer applied has a bonding layer component and a covering layer component corresponding to the abovementioned DE-A 38 32 692 and at the same time the layer structure of the hard material layer is optimized in such a way that the bonding layer component of the hard material layer has not only sufficiently high adhesion properties to the working surface of the shut-off body but can also reliably take up the high residual stresses of the comparatively hard and brittle sliding layer component of the hard material layer. It is here advantageous if, according to the invention, the sliding layer component is selected so as to be essentially thin and the bonding layer component is, in comparison, selected so as to be sufficiently thick for it to be able to take up the residual stresses of the sliding layer component.

The bonding layer component therefore has, according to the invention, the dual task of, on the one hand, reliably maintaining the necessary adhesion to the shut-off body even under extreme hot-water stressing at 95° C. over long operating times of 1000 and more hours and, on the other hand, being able to take up the residual stresses of the sliding layer component in the long term without significant loss of adhesive strength. Surprisingly, the heat treatment according to the invention significantly improves and ensures in the long term these properties of the bonding layer component.

The heat treatment of the shut-off body can be carried out after it has been coated within the coating chamber or else outside the latter, e.g. in an autoclave or similar pressure vessel. The heat treatment can be carried out in an oxygen-containing atmosphere or in air or in the presence of air at atmospheric pressure. The heat treatment can be carried out at temperatures of from 100 to 1500° C., preferably between 400 and 1000° C., with heat-treatment times being able to be from 0.5 to 60 min. Excellent results are achieved at temperatures of 500 and 900° C.

DETAILED DESCRIPTION OF THE INVENTION

Figure 1:
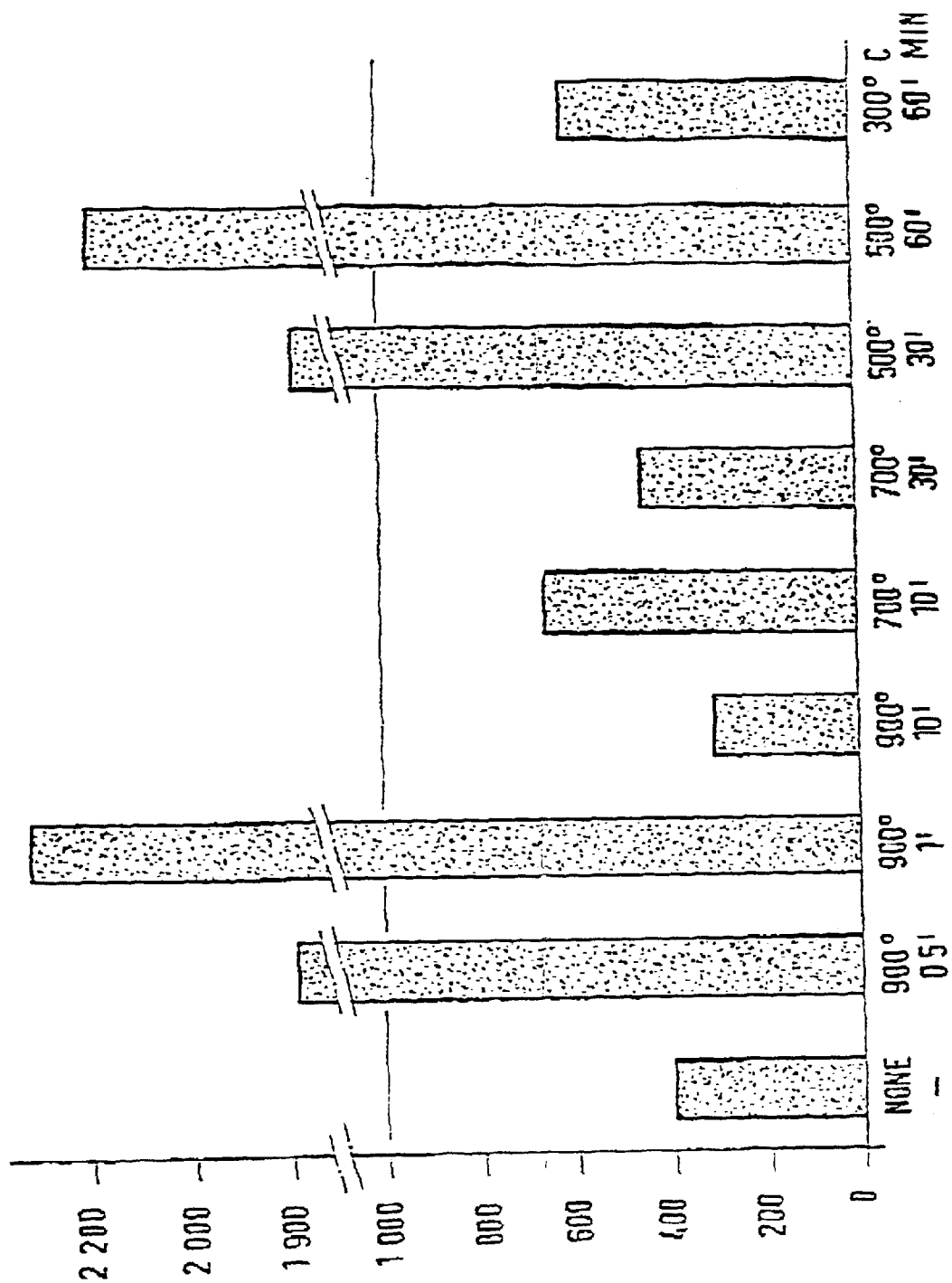

The invention is described below by means of an illustrative embodiment, without being restricted in any way.

Coating is carried out using a coating chamber which corresponds essentially to the coating chamber as already disclosed in DE-A 38 32 692.

The known coating chamber consists in principle of an electrically conductive chamber floor to which is connected a likewise electrically conductive chamber housing closed on all sides. The chamber floor has an insulated connection for a lead-through which provides an electrical connection between the cathode serving as cathodic support and an electrical supply in the form of a high-frequency apparatus. The shut-off bodies are placed on the cathodic support with the surface to be coated facing upwards. In the present case, the shut-off bodies are, without restriction, $Al_2O_3$ ceramic plates for hydraulic valves, where the ceramic discs are coated with a hard material layer of the type described in DE-A 38 32 692 and comprising a bonding layer component and a subsequent covering layer component.

The chamber floor additionally has a second connection for a suction pipe which is connected to a vacuum pump unit. Finally, the chamber floor has connections for feeding process gases into the coating chamber.

To carry out a coating operation, the vacuum pump unit is first switched on and a pressure of about $8\times10^{-5}$ mbar is set in the coating chamber. Subsequently, argon is passed into the coating chamber via a gas feed tube until a gas pressure of about 6 $\mu$bar has been reached. The high-frequency apparatus is then switched on and the glow discharge is ignited. A cathode DC potential of from about 600 to 800 V is set. The coating unit here operates first as cathode atomization (sputtering) unit in which the cathodic support and the ceramic plates lying thereon are physically etched by ion bombardment. The etching time is from about 15 to 25 min, preferably 20 min.

The inflow of argon into the chamber is throttled back in stages somewhat before the end of the etching period and at the same time tetramethylsilane (TMS) is fed into the chamber, the feed being increased in stages, so as thereby to obtain as gentle as possible a transition to the bonding layer component of the hard material layer. At a reduced cathode potential of from about 500 to 600 V, the bonding layer component of the hard material layer is deposited on the argon-etched surfaces for from about 15 to 30 min until a thickness of about 1 $\mu$m is reached. This layer is primarily an amorphous silicon-containing carbon/hydrogen layer. The sliding layer component is subsequently deposited on the bonding layer component, with, in the case of the example, a gas mixture of TMS and hexane in a ratio of from about 1:1.5 to about 1:8, preferably from about 1:2 to 1:5, being established in the coating chamber. Excellent results are achieved with a mixing ratio of 1:2.

Also to obtain a gentle transition from the bonding layer component to the sliding layer component, the TMS feed is throttled back in stages during a transition time, and the feed of hexane is correspondingly increased in stages until the selected TMS/hexane mixture has been reached. The time between the individual adjustment steps from stage to stage is in each case about 3 s. The coating time for the sliding layer component is, depending on the selected thickness of the sliding layer component of from 0.4 $\mu$m to 0.9 $\mu$m, from about 10 to 20 min. The silicon content of the sliding layer component is significantly less than that of the bonding layer component. Correspondingly, the carbon content of the sliding layer component is significantly higher than that of the bonding layer component. The thickness of the sliding layer component is, according to the invention, advantageously selected so as to be thinner than the thickness of the bonding layer component, so that the bonding layer component can take up the relatively high residual stress of the sliding layer component without significantly impairing its adhesion to the working surface of the shut-off body. The thickness ratio of bonding layer component to sliding layer component is from about 1:0.9 to 1:0.4, preferably 1:0.6.

According to the invention the shut-off bodies coated in the above manner (in the case of the example these are ceramic plates of $Al_2O_3$) are subjected to a targeted heat treatment. However, the invention is not restricted to such shut-off bodies, neither in respect of the configuration of the shut-off bodies nor in respect of the applied hard material layer. Thus, the hard material layers can also be homogeneous or lamellar. The hard material layer can also be one in which a bonding layer as described in DE-A 38 32 692 is not required and the covering layer can achieve sufficient adhesion when applied directly to the shut-off body, e.g. of $Si_3N_4$.

EXAMPLE

The coating batch C 3099 for ceramic plates, in which the sliding layer component was produced at a mixing ratio of TMS:hexane of about 1:2 and the thickness ratio of bonding layer component to sliding layer component is about 1 $\mu$m:0.6 $\mu$m, was subjected to a further heat treatment at between 300 and 900° C. for from 0.5 to 60 min. The result is shown in a bar graph in the attached drawing in comparison with an untreated plate. On the ordinate, the operating times of the ceramic plates in a valve under a hot-water stress of 95° C. are shown. Without further heat treatment, the ceramic plates have a hot-water resistance at 95° C. of about 400 h.

Excellent results were achieved with a further heat treatment at 900° C. for 0.5 and 1 min and with a further heat treatment at 500° C. for 30 and 60 min. Peak results were achieved at 900° C. for 1 min and at 500° C. for 1 h, giving a hot-water resistance of above 2200 h in each case.

We claim:

1. A sealing element, particularly for shut-off and regulating valves, comprising a shut-off body of a metallic or nonmetallic material having a hard material layer containing carbon and silicon applied to a sealing surface of the shut-off body by plasma chemical vapor deposition or plasma polymerization, in a coating chamber, the hard material layer comprising:
   a bonding layer component applied to the sealing surface of the shut-off body and
   a subsequent sliding layer component,
   the carbon-containing bonding layer component having a first silicon content favoring adhesion to the sealing surface of the shut-off body and
   the subsequent carbon-containing sliding layer component having a second silicon content lower than that of the bonding layer component, or being silicon-free, to achieve low coefficients of sliding friction and static friction, characterized in that
   the sliding layer component being selected so as to be thinner than the bonding layer component being selected so as to be comparatively thick to take up the residual stresses of the sliding layer component and that
   the hard metal layer is heat treated.

2. A process for producing the sealing element according to claim 1, characterized in that the shut-off body is, after being coated, heat treated in the coating chamber.

3. A process for producing the sealing element according to claim 1, characterized in that the shut-off body is heat treated outside the coating chamber.

4. A process according to claim 2 or 3, characterized in that the heat treatment is carried out in an oxygen-containing atmosphere.

5. A process according to claim 2 or 3, characterized in that the heat treatment is carried out in air or in the presence of air at atmospheric pressure.

6. A process according to claim 2 or 3, characterized in that the heat treatment is carried out in a water bath.

7. A process according to claim 2 or 3, characterized in that the heat treatment is carried out in a pressure vessel.

8. A process according to claim 2 or 3, characterized in that the temperature of the heat treatment is selected as a function of a layer thickness structure and/or composition of the hard material layer comprising the bonding and sliding layer components.

9. A process according to claim 8, characterized in that the deposition of the bonding layer component is carried out using tetramethylsilane and the deposition of the sliding layer component is carried out using a gas mixture of tetramethylsilane and hexane, in that the mixing ratio of tetramethylsilane:hexane is from about 1:1.5 to 1:5, preferably about 1:2.

10. A process according to claim 2 or 3, characterized in that the heat treatment time is substantially matched to the total coating time.

11. A sealing element according to claim 1, characterized in that the thickness ratio in m of bonding layer component:sliding layer component is from about 1:0.9 to 1:0.4, preferably 1:0.6, to thereby take up residual stresses of the sliding layer component.

12. A process according to claim 2 or 3, characterized in that the heat treatment is from about 30 min to about 1 h at about 500° C. or from about 0.5 min to about 1 min at about 900° C. to thereby provide a long useful life of hot-water resistance.

* * * * *